United States Patent
Shin et al.

(10) Patent No.: US 11,624,109 B2
(45) Date of Patent: Apr. 11, 2023

(54) METHOD FOR MANUFACTURING TRANSPARENT CONDUCTIVE FILM

(71) Applicant: LG CHEM, LTD., Seoul (KR)

(72) Inventors: Dongmyung Shin, Daejeon (KR); Jongmin Moon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 228 days.

(21) Appl. No.: 16/758,967

(22) PCT Filed: Nov. 13, 2018

(86) PCT No.: PCT/KR2018/013833
§ 371 (c)(1),
(2) Date: Apr. 24, 2020

(87) PCT Pub. No.: WO2019/124743
PCT Pub. Date: Jun. 27, 2019

(65) Prior Publication Data
US 2021/0040598 A1    Feb. 11, 2021

(30) Foreign Application Priority Data
Dec. 22, 2017 (KR) .......................... 10-2017-0177885

(51) Int. Cl.
*C23C 14/08* (2006.01)
*C23C 14/34* (2006.01)
(Continued)

(52) U.S. Cl.
CPC .............. *C23C 14/08* (2013.01); *C23C 14/34* (2013.01); *H01B 5/14* (2013.01); *H01B 13/0036* (2013.01);
(Continued)

(58) Field of Classification Search
CPC ....... C23C 14/08; C23C 14/34; C23C 14/088; C23C 14/35; C23C 14/082;
(Continued)

(56) References Cited

U.S. PATENT DOCUMENTS 5,597,411 A * 1/1997 Fritzsche ............ H01L 39/2448
117/937
2002/0175622 A1* 11/2002 Otani ........................ H01J 11/12
313/518
(Continued)

FOREIGN PATENT DOCUMENTS

CN   103762227       4/2014
CN   105489270 A     4/2016
(Continued)

OTHER PUBLICATIONS

Wu, et al., Properties of nano-thick BaSnO3/Cu/BaSnO3 multilayer thin films: the role of substrate temperature, 2016, J Mater Sci, 27, 12604-12609 (Year: 2016).*
(Continued)

*Primary Examiner* — Jennifer Wecker
*Assistant Examiner* — Patrick S Ott
(74) *Attorney, Agent, or Firm* — Dentons US LLP

(57) ABSTRACT

A method of manufacturing a transparent conductive film comprising preparing a substrate; and forming a thin film comprising—a compound of Chemical Formula 1 on the substrate:

$$Ba_pLa_qSn_mO_n \qquad \text{Formula 1}$$

wherein p, q, m and n are atomic content ratios, p, m and n each are independently more than 0 and less than or equal to 6, and q is 0 or 1, (Continued)

wherein the forming of the thin film is performed by an RF sputtering process at a temperature of 250° C. or lower.

5 Claims, 6 Drawing Sheets

(51) Int. Cl.
  *H01B 5/14* (2006.01)
  *H01B 13/00* (2006.01)
  *H01L 21/285* (2006.01)
  *H01G 9/20* (2006.01)
(52) U.S. Cl.
  CPC ........ *H01G 9/2027* (2013.01); *H01L 21/2855* (2013.01)
(58) Field of Classification Search
  CPC .. C23C 14/3414; H01B 5/14; H01B 13/0036; H01B 13/0026; H01G 9/2027; H01L 21/2855; H01L 2251/303; H01L 51/442; H01L 51/5203; Y02E 10/549
  See application file for complete search history.

(56) References Cited

U.S. PATENT DOCUMENTS

| | | | |
|---|---|---|---|
| 2007/0170053 A1 | 7/2007 | Ohashi et al. | |
| 2008/0153280 A1* | 6/2008 | Li | H01L 31/1884 438/608 |
| 2010/0258806 A1 | 10/2010 | Nakayama et al. | |
| 2010/0259466 A1* | 10/2010 | Inoue | H01J 11/12 345/60 |
| 2010/0328997 A1* | 12/2010 | Choi | H01L 45/1625 257/E21.52 |
| 2011/0160065 A1* | 6/2011 | Aytug | C23C 28/00 428/209 |
| 2011/0163181 A1 | 7/2011 | Fujii et al. | |
| 2011/0308580 A1* | 12/2011 | Seidel | C30B 29/24 136/252 |
| 2015/0048282 A1* | 2/2015 | Char | H01L 21/02565 252/519.1 |
| 2015/0329976 A1* | 11/2015 | Tamura | C25B 11/091 204/248 |
| 2016/0041418 A1* | 2/2016 | McGinnis | G02F 1/13439 349/123 |
| 2016/0190377 A1* | 6/2016 | Green | H01L 51/4213 438/74 |
| 2017/0213653 A1* | 7/2017 | Baniecki | H01G 9/2036 |
| 2019/0006120 A1* | 1/2019 | Baniecki | C25B 11/0773 |
| 2019/0112721 A1* | 4/2019 | Aburaya | C25B 11/051 |
| 2020/0325032 A1 | 10/2020 | Noh et al. | |

FOREIGN PATENT DOCUMENTS

| | | |
|---|---|---|
| EP | 1820878 A2 | 8/2007 |
| JP | 2003-016949 | 1/2003 |
| JP | 2015-529002 | 10/2015 |
| KR | 10-20070077130 | 7/2007 |
| KR | 10-20110063769 | 6/2011 |
| KR | 10-20120060602 | 6/2012 |
| KR | 101337297 | 12/2013 |
| KR | 10-1463234 | 11/2014 |
| KR | 10-20160115076 | 10/2016 |
| KR | 10-20170114093 | 10/2017 |
| KR | 10-20170125784 | 11/2017 |
| TW | 200927972 | 7/2009 |
| TW | 201041145 | 11/2010 |
| WO | 2010-032459 | 3/2010 |
| WO | 2017-176038 | 10/2017 |

OTHER PUBLICATIONS

Luo, et al., Determination of the effective mass and nanoscale electrical transport in La-doped BaSnO3 thin films, 2015, Current Applied Physics, 16, 20-23 (Year: 2015).*

Luo, et al., High carrier mobility in transparent Ba1—xLaxSnO3 crystals with a wide band gap, 2012, Applied Physics Letters, 100 (Year: 2012).*

Luo et al., "High carrier mobility in transparent Ba1—xLaxSnO3 crystals with a wide band gap," Applied Physics Letters 100: 172112 (2012), published online Apr. 27, 2012, 5 pages.

Luo et al., "Determination of the effective mass and nanoscale electrical transport in La-doped BaSnO3 thin films," Current Applied Physics 16(1): 20-23 (2016).

Wu, et al., "Properties of nano-thick BaSnO3/Cu/BaSnO3 multilayer thin films: the role of substrate temperature," J Mater Sci: Mater Electron 27:12604-12609 (2016).

Luo, et al., "Rectifying behavior and photoinduced characteristic in La-doped BaSnO3/p-Si heterojunctions," Phys. Status Solidi A 211, No. 3, 705-708 (2014).

* cited by examiner

[Figure 1]
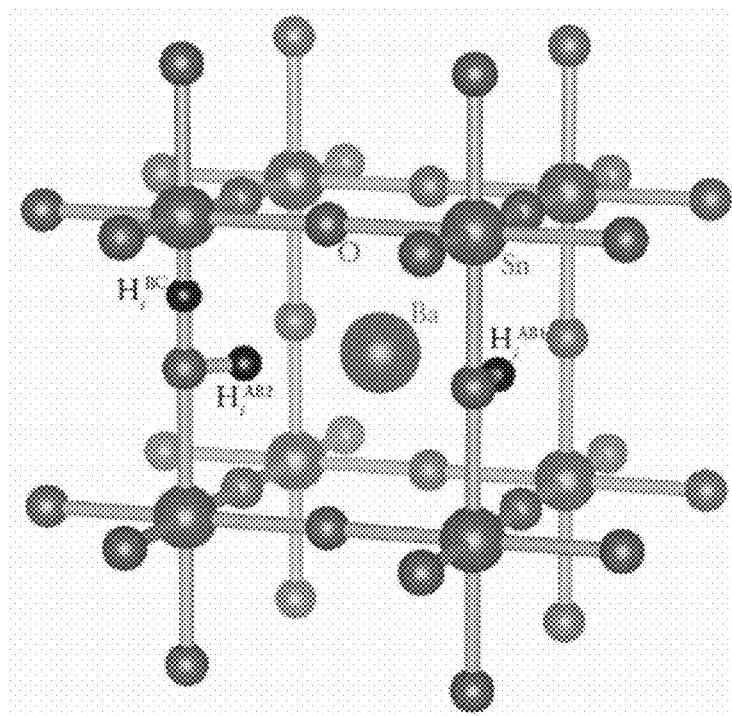
[Figure 2]
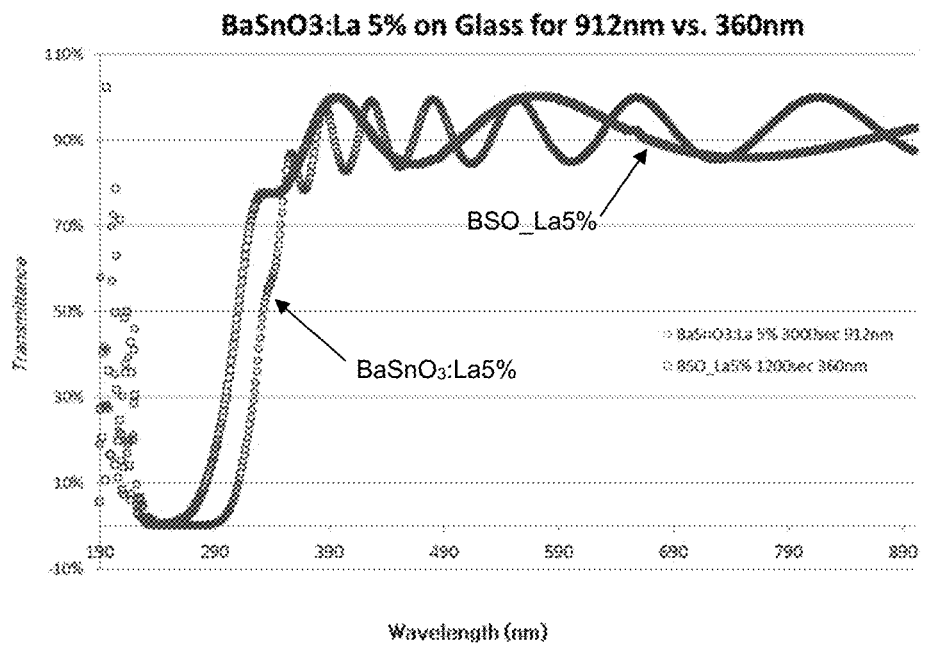

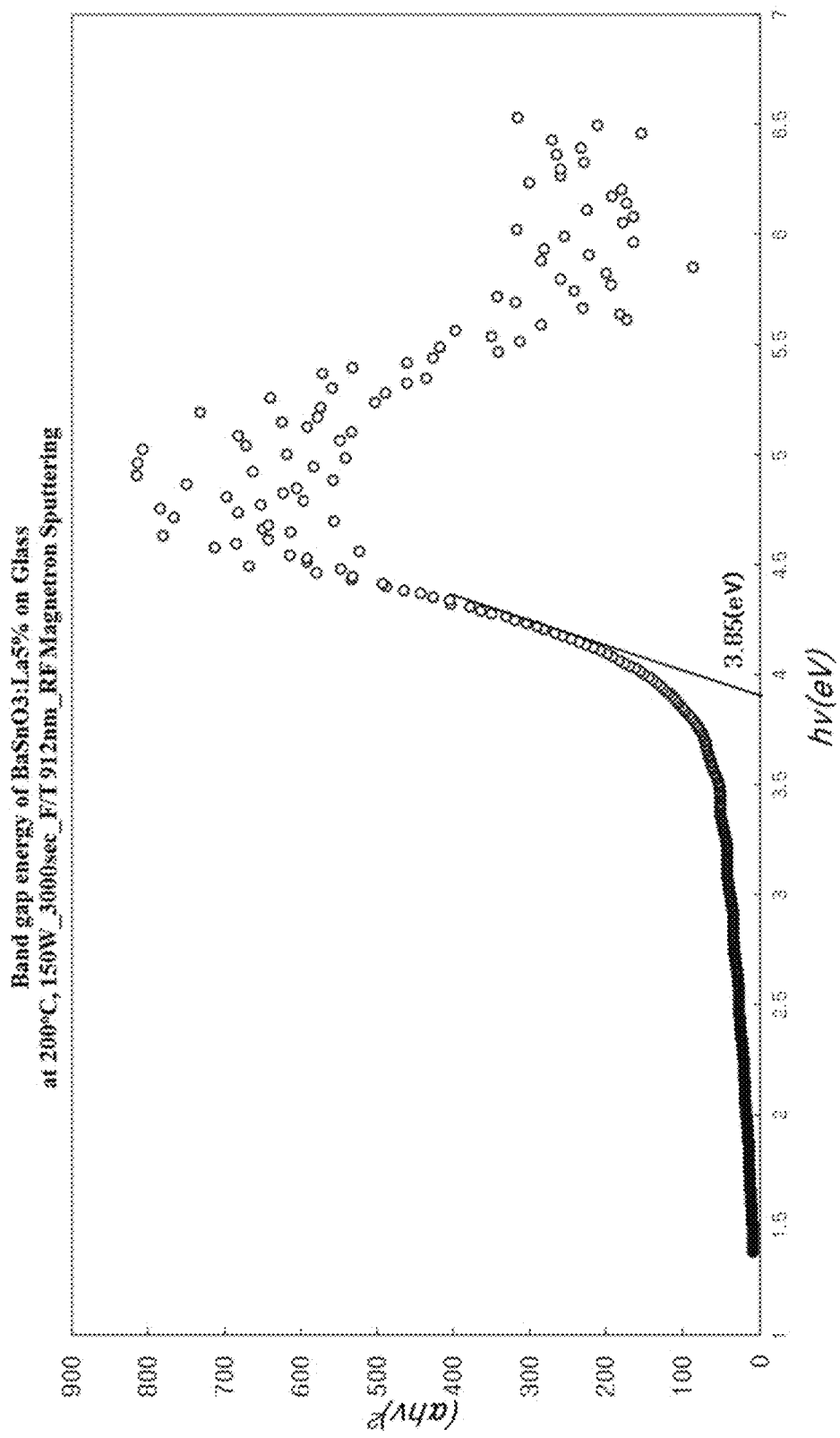
[Figure 3]

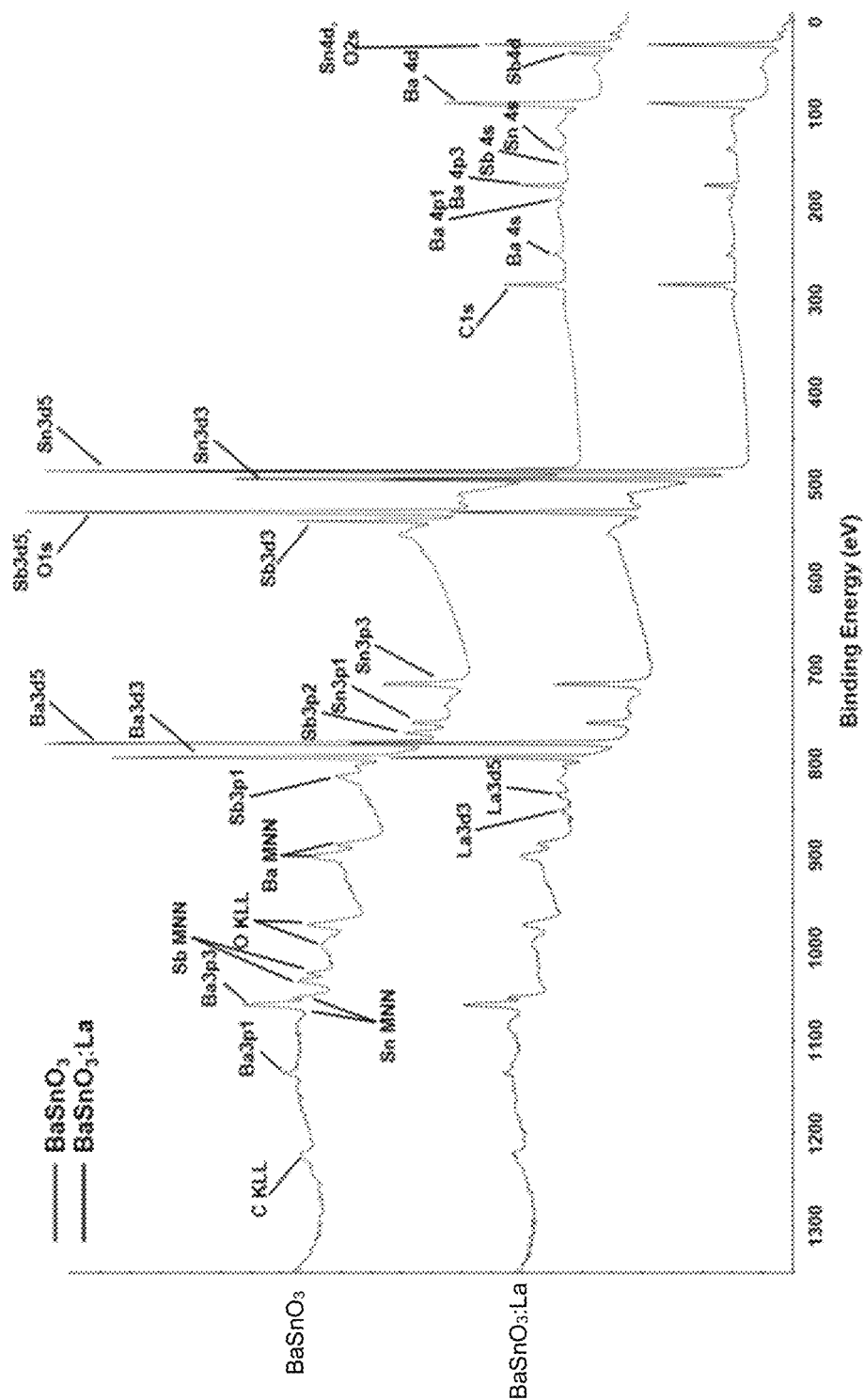
[Figure 4]

[Figure 6]
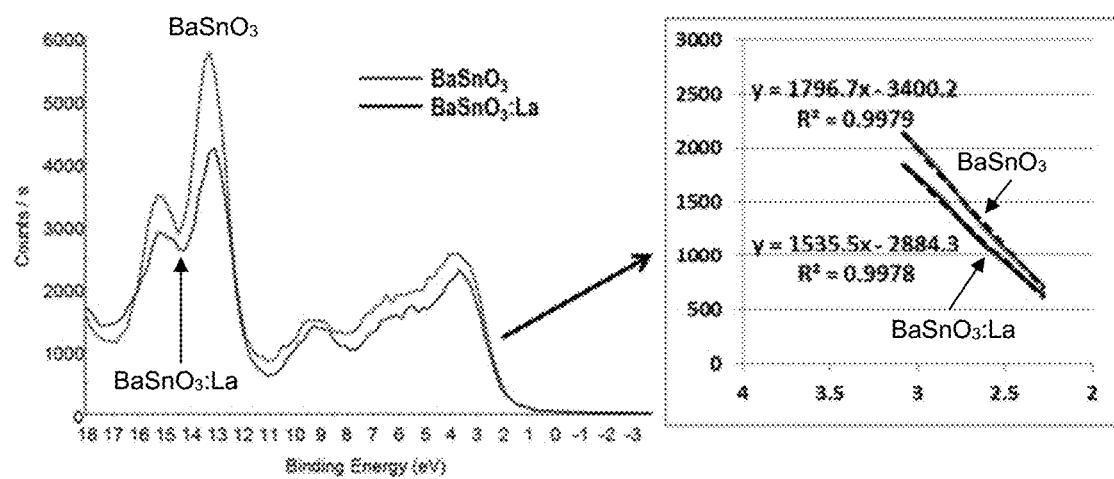
[Figure 7]
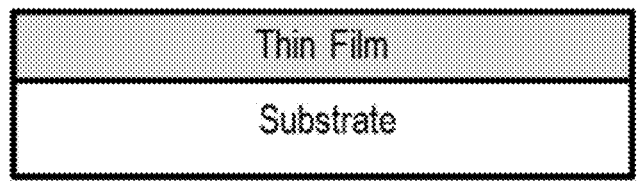

METHOD FOR MANUFACTURING TRANSPARENT CONDUCTIVE FILM

CROSS-REFERENCE TO RELATED APPLICATIONS

This application is a National Stage Application of International Application No. PCT/KR2018/013833 filed on Nov. 13, 2018, which claims priority to and the benefit of Korean Patent Application No. 10-2017-0177885 filed in the Korea Intellectual Property Office on Dec. 22, 2017, the entire contents of which are incorporated herein by reference.

TECHNICAL FIELD

The present application relates to a method of manufacturing a transparent conductive film.

BACKGROUND

A transparent conductive film is a thin film having high light transmittance and an electrical conductive property and is widely used as a voltage-applying common electrode or a pixel electrode such as a liquid crystal display, an electrochromic display (ECD), an organic electroluminescence element, a solar cell, a plasma display panel, a flexible display, electronic paper, and a touch panel.

In transparent conducting oxides (TCO), it is important to design materials to have high conductivity while transmitting light of a visible light region. In order for TCO to be transparent in the visible light region (wavelength of 400 nm to 700 nm), an electronic energy bandgap should be 3.1 eV or more, which is an electromagnetic wave energy of 400 nm wavelength.

Typical oxide semiconductors satisfying such characteristics are ZnO (3.3 eV), $In_2O_3$ (3.7 eV), and $SnO_2$ (3.6 eV). In general, TCO has light transmittance of 80% or more in a visible light region, and resistivity as an electrical characteristic has a value of about $10^{-4}$ Ωcm or less.

In order to identify materials to be used for such TCO, research conducted up to now has been mainly on a method of performing doping and alloying in various materials. In particular, $In_2O_3$ exhibits a lower specific resistance value than that of $SnO_2$ or ZnO. For this reason, $In_2O_3$ has been first commercially available, and ITO (Sn-doped $In_2O_3$) has been used up to now.

ITO is a material currently applied to electrodes for a display, such as a light emitting diode (LED), liquid crystal display (LCD), and plasma display panel (PDP), and a solar cell, is generally about $10^{-4}$ Ωcm and is about $10^{-5}$ Ωcm at a laboratory level, and has a low specific resistance value of a level similar to that of a metal.

However, such ITO has a defect in that In is expensive as a rare element, and when the ITO is exposed to an oxygen plasma frequently used in a flat panel display manufacturing process, the ITO has a defect in that In or Sn is oxidized, which degrades electrical and optical characteristics. Furthermore, ITO is an n-type semiconductor and is known as a material that may not be converted into a p-type semiconductor. Therefore, there is a limitation that a homojunction circuit element may not be made of only ITO.

BRIEF DESCRIPTION

Technical Problem

In the art, a research is required on a method of manufacturing a transparent conductive film having excellent characteristics and a simple manufacturing process.

Technical Solution

An exemplary embodiment of the present application provides a method of manufacturing a transparent conductive film, the method comprising:
preparing a substrate; and
forming a thin film comprising a compound of the following Formula 1 on the substrate,
wherein the forming of a thin film is performed by a radio frequency (RF) sputtering process at a temperature of 250° C. or lower:

$$Ba_pLa_qSn_mO_n \qquad \text{Formula 1}$$

wherein in Formula 1:
p, q, m, and n are atomic content ratios,
p, m, and n each are independently more than 0 and less than or equal to 6, and
q is 0 to 1.

Advantageous Effects

A transparent conductive film according to an exemplary embodiment of the present application comprises a compound of Formula 1, thereby having excellent conductivity and optical transmittance. Further, the method of manufacturing a transparent conductive film according to an exemplary embodiment of the present application is characterized by being capable of performing low temperature deposition at 250° C. or lower by using an RF sputtering process and being capable of performing high speed deposition over a large area.

DESCRIPTION OF DRAWINGS

FIG. 1 is a diagram schematically illustrating a structure of $BaSnO_3$ according to an exemplary embodiment of the present application.

FIG. 2 is a graph illustrating optical transmittance of a transparent conductive film according to an exemplary embodiment of the present application.

FIG. 3 is a graph illustrating band gap energy of a transparent conductive film according to an exemplary embodiment of the present application.

FIGS. 4 to 6 are graphs illustrating XPS analysis results of a transparent conductive film according to an exemplary embodiment of the present application.

FIG. 7 is a diagram schematically illustrating a transparent conductive film according to an exemplary embodiment of the present application.

DETAILED DESCRIPTION

Figure 5A:
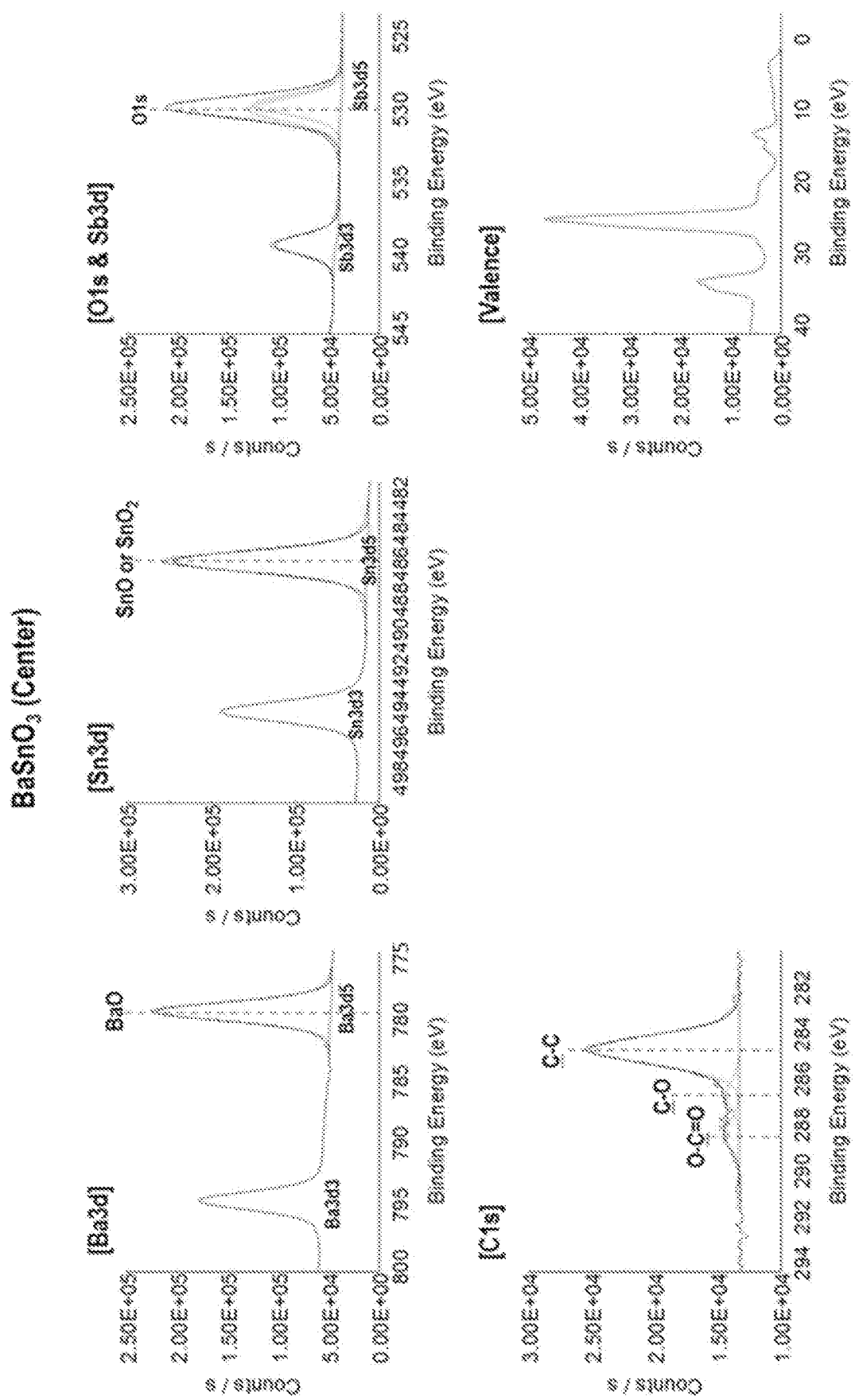

Hereinafter, the present application will be described in detail.

The transparent conductive film of the present application can be applied not only to flat panel display industries such as a liquid crystal display (LCD) and a plasma display panel (PDP), but also to next generation flexible devices, transparent active matrix organic light emitting diodes (AMO-LED), organic light emitting diode (OLED) lighting, and solar cells.

Efforts to overcome limitations of a photoelectric performance, such as instability of metal oxide materials and electrical mobility of silicon-based semiconductors, have been performed for over past 30 years. In particular, it has only recently been possible to see academic suspicion or effective evidence of the underlying problem of where state instability of metal oxides comes from.

In more detail, a structure in which metal cations are enclosed by oxygen anions (2-) is a cubic or a hexagon, and a metal site has a typical octahedral (6 coordinate) or tetrahedral (4 coordinate) configuration. Various crystallographic forms (rocksalt, corundum, rutile, wurtzite, fluorite, perovskite and spinel) thereof can also cause electrical and optical variations. It is common to find an original problem in the transition from a valence band composed of oxygen 2p orbitals and metal 3d orbitals in an electronic structure to a conduction band consisting of orbitals of 4s, 5s, and so on.

Existence of d orbitals is the cause of undesired inelastic scattering and this is because existence of d orbitals leads to generation of phonons between energy bands to cause an energy loss.

Accordingly, to find or to synthesize a d orbital-free metal oxide material can be the answer to solve the instability in metal oxide materials. A Ruddlesden-Popper (RP) type superlattice material can be thought of as a metal oxide that can be selected for desired high mobility or fabrication of magnetic devices in the optoelectronic technology field.

Perovskite, a more complex material to be fabricated by one step than a general binary metal oxide material, shows a possibility as a superconductor. For example, when using a dopant of a 4d or 5d orbital material, various magnetic properties can be secured. The above-mentioned RP type superlattice material can perform modulation further added in the perovskite. The RP type superlattice material can couple spins for an electrooptic function and magnetism and have a much more ordered three-dimensional structure than that of general metal oxide.

The present application provides a method of manufacturing a transparent conductive film containing barium tin oxide (BSO) as a material of a perovskite structure. A structure of $BaSnO_3$ as barium tin oxide is schematically illustrated in FIG. 1. More specifically, FIG. 1 shows that hydrogen that considers defects exists at four different positions in an oxygen site in a lattice.

Table 1 shows physical properties of thin films (thickness reference of about 120 nm to 140 nm) produced using BSO and ITO.

TABLE 1

|  | BSO | ITO |
| --- | --- | --- |
| Sheet resistance($\Omega$/sq) | <30 | 40 to 60 |
| Coefficient of thermal expansion | <$10^{-6}$ | $10^{-6}$ |
| Electron mobility($cm^2V^{-1}s^{-1}$) | >300 | 40 to 45 |
| Carrier concentration ($cm^{-3}$) | $10^{21}$ | 2 to 3 × $10^{20}$ |
| Optical transmittance (%) | >92 | 89 to 90 |
| Band gap energy (eV) | 3.1 | 2.9 |
| Refractive index | 1.9 to 2.3 | 1.9 |

As shown in Table 1, BSO is a perovskite material having high electron mobility at a room temperature and having very high optical transmittance.

A method of manufacturing a transparent conductive film according to an exemplary embodiment of the present application comprises preparing a substrate; and forming a thin film comprising a compound of the following Formula 1 on the substrate:

$$Ba_pLa_qSn_mO_n \quad \text{Formula 1}$$

wherein in Formula 1:

p, q, m, and n are atomic content ratios, p, m, and n each are independently more than 0 and less than or equal to 6, and q is 0 to 1.

In an exemplary embodiment of the present application, the substrate is not particularly limited, and a substrate in the related art can be used. More specifically, the substrate can be a glass substrate, a silicon substrate, a plastic substrate, or the like, but is not limited thereto. Further, the plastic substrate can comprise one or more of polyethylene terephthalate (PET), polyethylene naphthalate (PEN), cyclo-olefin polymer (COP), polyimide (PI), and the like, but is not limited thereto.

According to an exemplary embodiment of the present application, the forming of the thin film can be performed by an RF sputtering process at a temperature of 250° C. or lower, and can be performed by an RF sputtering process at a temperature of 100° C. to 250° C.

Conventionally, in production of barium tin oxide (BSO) or La doped barium tin oxide (BLSO), molecular beam epitaxy and pulsed laser deposition were used, and a high temperature of 550° C. or more was required. However, in an exemplary embodiment of the present application, it is characterized that a thin film comprising BSO or BLSO can be produced by an RF sputtering process at a low temperature of 250° C. or less.

In order to deposit BLSO on a general plastic (PET, COP, PEN) substrate, a temperature of about 200° C. or excessively below 250° C. is essential. This is because, at temperatures above this temperature, the plastic substrate causes deformation, and physical properties such as shape and optical transmittance are difficult to be maintained. In order to overcome this problem, the present invention proposes a method of removing atoms of a BLSO target by physical blow without increasing a temperature of the substrate differently from other deposition methods. It is an important advantage of the present invention that a high mobility BLSO transparent conducting thin film of the same level as other deposition methods performed at high temperatures can be formed even at low temperatures using sputtering. Thereby, there is an advantage that a high mobility thin film can be produced without being limited by the kind of substrate and the range of use.

In the RF sputtering process, a compound target of Formula 1 can be mounted in a chamber (usually maintained at $10^{-3}$ to $10^{-8}$ torr) and an operating gas such as Ar can be injected into and used in the chamber. In particular, RF magnetron sputtering can be applied in a roll-to-roll process. In this case, a thickness of the thin film containing the compound of Formula 1 can be adjusted to 200 nm to 1,000 nm.

In an exemplary embodiment of the present application, the RF sputtering process can be performed at a deposition rate of 0.5 Å/sec to 1.5 Å/sec. Further, the RF sputtering process can use a compound target of Formula 1.

In an exemplary embodiment of the present application, sheet resistance of the thin film containing the compound of Formula 1 can be 10 $\Omega$/sq to 14 $\Omega$/sq, and optical transmittance of the thin film can be 92% or more in a thickness of 350 nm to 1000 nm.

Sheet resistance of the thin film can be measured through a contact type measuring device (e.g., 4-probe point measurement) or a non-contact type measuring device (EP-80P noncontact resistivity tester, NAPSON Corp.). Optical transmittance can be measured using a UV-Visible Spectrometer, and in optical bandgap measurement, an optical transmittance value on a wavelength basis can be obtained by using a Tauc relationship equation $(ahv)^n$ $n=\frac{1}{2}$ to 2 and plotting for hv as shown in FIG. 3 and by performing extrapolation approximation thereto. In the Tauc relationship equation, h is a Planck constant, v is a wave number, a is an optical absorption coefficient, and n is a value for a direct bandgap (1 or 2) or an indirect bandgap (0.5 or 1.5) that can be seen from an extrapolation approximate slope.

The characteristic sheet resistance and optical transmittance are characteristics of only the BLSO thin film. Sheet resistance for a glass or plastic substrate is infinitely high, but when sheet resistance is measured after a BLSO thin film is formed, a value of 10 to 14 $\Omega$/sq or less can be realized. Further, optical transmittance can be obtained by measuring the glass substrate or the plastic substrate alone as a baseline and then extracting transmittance of only the BLSO layer according to a general form of a transparent thin film optical transmittance measurement method.

A transparent conductive film produced according to an exemplary embodiment of the present application can be applied to electronic devices. A transparent conductive film according to an exemplary embodiment of the present application is schematically shown in FIG. 7 below.

More specifically, the transparent conductive film according to the present application can be used for a common electrode or a pixel electrode such as a liquid crystal display (LCD), an electrochromic display (ECD), an organic electroluminescence element, a solar cell, a plasma display panel, a flexible display, electronic paper, and a touch panel.

In recent years, BLSO has been in the spotlight in that when BLSO is used as an electron transporting layer (ETL) of a perovskite solar cell, overall efficiency thereof can be largely improved. Even though colloidal BLSO in a liquid state is used, a coating condition thereof is very poor, but there is a scientific treatise (Shin et al., Science 356: 167-171 (2017)) that energy efficiency of the perovskite solar cell was improved by about 1.5% from 19.7% to 21.2%. When a thin film having high crystallinity and a more accurate chemical quantification formula is used as in the present invention, there is a merit that energy efficiency of the perovskite solar cell can be increased by at least 2 to 3 times or at most 4 to 5 times. This is a category of general knowledge in which an electric resistance value is lowered to a level of a colloidal thin film, an amorphous thin film, a mixed crystalline thin film, and a monocrystal thin film.

As noted in Examples 3 and 4 of the present invention, using a stoichiometric equation, a BLSO thin film deposition known to be available at a high temperature and high vacuum state of 550° C. or more and $10^{-5}$ torr or less, can be achieved under a condition of low temperature and high speed sputtering using the present invention. Most ideally, it is a perovskite crystal having a ratio of Ba/Sn/O (it is preferable that a dopant La is substituted with 10% or less to Ba) is 1/1/3, but an actual element ratio cannot help being different even in any deposition method. A stoichiometric equation in the present invention is at a level that does not deviate greatly from an ideal La-doped $BaSnO_3$ structure in such a meaning.

EXAMPLES

Hereinafter, exemplary embodiments are given to facilitate understanding of the present application. However, the following exemplary embodiments are intended to illustrate the present application, and the scope of the present application is not limited thereby.

Example 1

$O_n$ a glass substrate having a thickness of 0.5 mm, a thin film was formed using a La 5% doped $BaSnO_3$ target and an RF sputtering process. The La 5% doped $BaSnO_3$ target used a 3 inch circular target (Taewon Science), and the conditions of the RF sputtering process are as follows.

RF power control: gun #3 set 150W, forward power: 148W, reflected power 1W, Bias: 66V, RF matching load indicate 508, tune indicate −154, Setting Temp.: 107° C., sputter time: 1,200 sec, vac. annealing 5 min Deposition rate: 0.7 Å/sec Gas: Ar 5 mTorr-10 mTorr A thickness of the produced thin film was 360 nm.

Example 2

The same procedure was performed as in Example 1 except that a sputter time was changed to 3,000 sec in conditions of the RF sputtering process. A thickness of the produced thin film was 912 nm, and a composition of the thin film was $Ba_{1.0}La_{0.087}Sn_{2.22}O_{4.83}$.

Thickness measurement of the thin film can be performed by an optical method such as an ellipsometer or image measurement such as an electron microscope (FE-SEM), or measurement can be performed using a simple instrument such as a micrometer. A composition of the thin film can be obtained by dividing a spectrum area of each element measured by monochromatic XPS (x-ray photoelectron spectroscopy, ESCA) by a chemical sensitivity factor and then by a ratio thereof.

Optical transmittance of the transparent conductive film produced in Examples 1 and 2 is shown in FIG. 2. FIG. 2 illustrates that La-doped $BaSnO_3$ on the glass substrate had optical transmittance of about 94% at a wavelength of 550 nm and optical transmittance of 92% or more at a wavelength of 650 nm. Waving of a transmission graph in a visible light region appears to be due to the difference in a refractive index between the glass substrate and the thin film. Although a thickness of the thin film was different by about 2.5 times, transmittance in the visible light region appeared to be almost identical.

The optical transmittance was obtained by substituting a y-axis % transmittance value to an x-axis wavelength in an UV-Visible spectrum as shown in FIG. 2.

Band gap energy of the transparent conductive film of Example 2 is shown in FIG. 3. When a direct gap is derived by applying the Tauc relationship, it can be seen that Eg approximates to 3.85 eV. Therefore, it is also proved by band gap measurement that the transparent conductive film of Example 2 does not suffer by comparison to a transparent conductor material (Eg>3.1 eV).

In optical bandgap measurement, an optical transmittance value on a wavelength basis can be obtained by performing $(ahv)^n$ $n=\frac{1}{2}$ to 2 plotting to hv as shown in FIG. 3 using a Tauc relationship Equation and by performing extrapolation approximation thereto. Here, h is a Planck constant, v is a wave number, a is an optical absorption coefficient, and n is a value for a direct bandgap (1 or 2) or an indirect bandgap (0.5 or 1.5) that can be seen from an extrapolation approximate slope.

Example 3

Example 3 was performed substantially the same as Example 1 except that a boron-doped silicon 100 monocrystal substrate was used instead of a glass substrate and that a setting temperature was 250° C. in conditions of the RF sputtering process. A thickness of the produced thin film was about 1,000 nm and a composition of the thin film was $Ba_{1.0}La_{0.11}Sn_{2.18}O_{5.43}$.

Example 4

The same procedure as that of Example 3 was performed except that a La non-doped $BaSnO_3$ target was used instead of a La 5% doped $BaSnO_3$ target. A thickness of the produced thin film was about 1,000 nm, and a composition of the thin film was $Ba_{1.0}Sn_{1.54}O_{3.96}$.

XPS analysis results of the transparent conductive films of Examples 3 and 4 are shown in FIGS. 4 to 6. More specifically, FIG. 4 shows survey scan spectra of BSO and BLSO. In order to examine crystallinity of the two BSO and BLSO, the two BSO and BLSO were deposited to 1000 nm, which is a somewhat high thickness. The BSO film generates plasma by flowing $O_2$ gas to Ar gas at a ratio of 50:1 in order to obtain the effect of p-type doping. About 11 Ω/sq was obtained through a non-contact sheet resistivity tester (EP-80P noncontact resistivity tester, NAPSON Corp.).

Figure 5B:
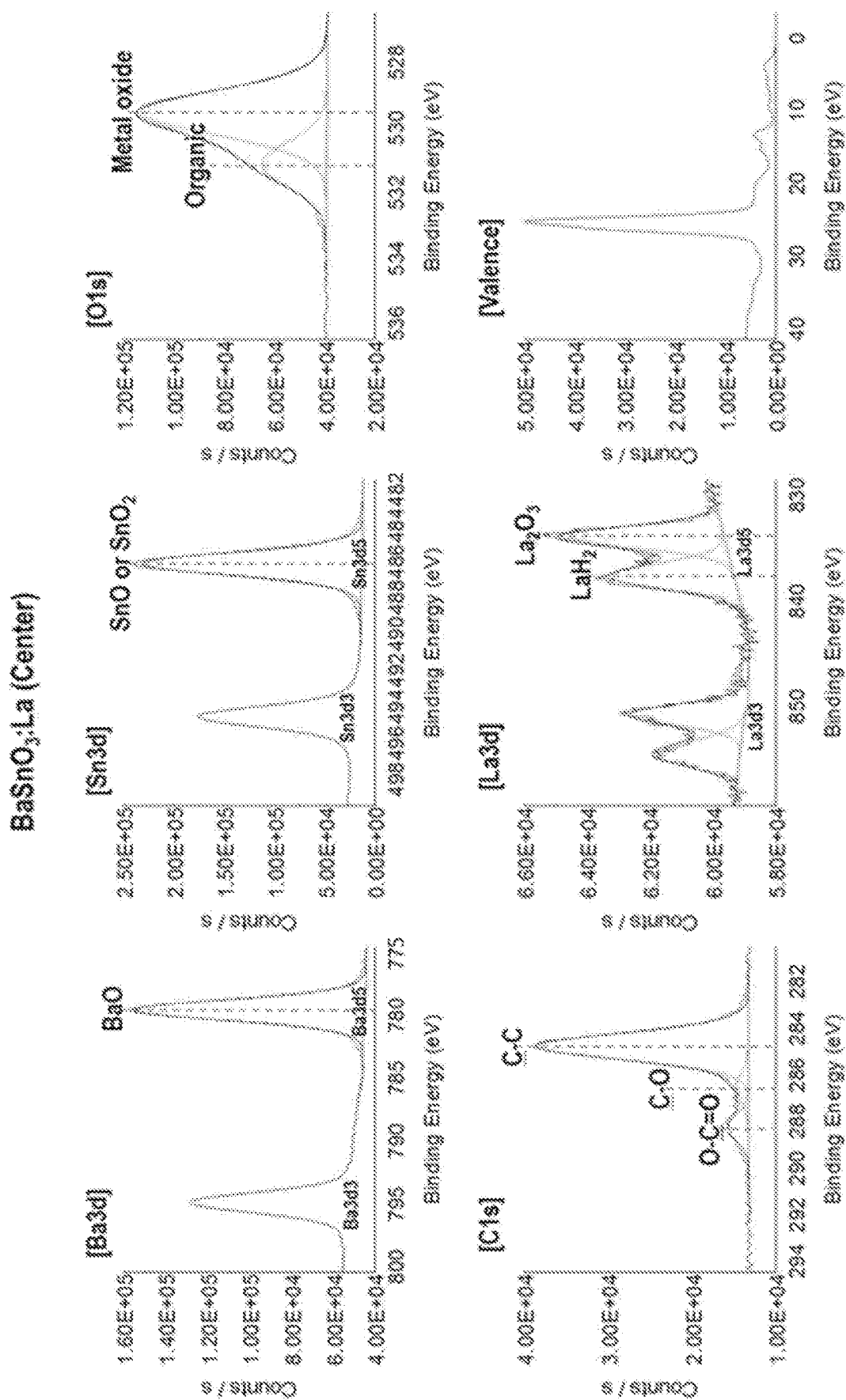

FIG. 5A shows a spectrum of orbital electrons located in the atomic interior, and because $Sb3d_{5/2}$ exists in a portion overlapped with O1s, distinction is not easy, but the presence of impurity antimony can be determined as the presence of $Sbd3_{3/2}$ orbital spectrum at the 539 eV point. FIG. 5B shows a valence band spectrum and an internal orbital of La 5% doped BSO, and particularly, the presence of La, which is an n-type dopant, is clearly represented. $La3d_{5/2}$ and $La3d_{3/2}$ spectra each can be separated into two to be interpreted as indicating the presence of $La_2O_3$ and $LaH_2$, which are side reaction materials, but can result from a LaO shake-up satellite of a stabilization process after electronic transition.

FIG. 6 illustrates a valence band spectrum of BSO and BLSO, and it was determined how much a valence band edge value is moved after La doping using extrapolation. It can be seen that La served as a factor of n-type doping when VBM is shifted to the left by about average 0.1 eV.

Comparative Example 1

Molecular beam epitaxy as a comparative example is a technique of typical high vacuum ($10^{-9}$ torr on idle, $10^{-5}$ to $10^{-6}$ torr on working) monocrystal thin film growth of a semiconductor epitaxy method started at Bell Lab of USA, and by raising a temperature of a silicon substrate or YSZ and $Al_2O_3$ monocrystal substrate to minimum 550° C. and maximum 800° C. to 900° C., a BLSO thin film was grown. Source materials used in such methods are Ba of 99.99% or more, Sn of 99.99% or more, and oxygen plasma (in a state in which an oxygen gas of about $10^{-5}$ torr is injected and maintained, plasma is generated by tuning with a 13.56 MHz RF source). A dopant material La (or LaO or $La_2O_3$) also used a grade of 99.99% or more. A size of the substrate is about 4 to 12 inches, which is a size of a Si wafer. Representative research groups include Schlom of Cornell University and Ahn of Yale University of USA.

Comparative Example 2

As a technique of depositing BLSO using a pulse laser deposition technique, a level of a deposition chamber is a high vacuum ($10^{-7}$ to $10^{-8}$ torr on idle, $10^{-4}$ to $10^{-5}$ torr on working), an $Al_2O_3$ monocrystal substrate or a Si monocrystal substrate can be used as a substrate, and a size thereof can be 2 inches to 3 inches. A target material was prepared with solid state synthesis-based pellets (produced by treating $BaCo_3$, $SnO_2$, and $La_2O_3$ powders with a high heat) in a $BaSnO_3$: La form and deposition was performed in a substrate by generating plasma plume with a laser beam such as Nd-YAG in the chamber. Unlike molecular beam epitaxy, it is a problem having sputtering targets that it is difficult to accurately adjust a rational formula of a BLSO target used in pulsed lasers. It is well known that a target of an accurate rational formula helps a chemical rational formula of a thin film for final deposition, and optimization of various deposition conditions to overcome this is a core of the deposition technique.

An excellent effect of the present invention is that an RF magnetron that can perform low-temperature high-speed roll-to-roll deposition was applied. Further, the present invention can be easily applied to a large-sized display or a large-sized solar cell because a large area can be deposited with a width of 550 mm or more. In a carrier density of $10^{18}$ to $10^{20}$ cm$^{-3}$ having a level of a transparent electrode material such as typical ITO and ZnO, mobility is equal to or more than two times of about 200 cm$^2$/Vsec, and in a carrier density of $10^{11}$ cm$^{-3}$, mobility up to about a maximum 3,000 cm$^2$/Vsec is shown. Sheet resistance of the present invention is also very excellent as 10 Ω/sq to 14 Ω/sq. Optical transmittance is measured as an average value of 92% or more, which is superior to that of any conventional transparent electrode material. A band gap well transmits light of a visible light wavelength band to be about 3.1 eV to maximum 3.85 eV, thereby exhibiting an excellent performance as a transparent electrode material. In addition, it is already acknowledged by academia that the material is a material that hardly undergoes a change with time in moisture or severe temperature conditions. The material is famous as a stable material that does not change even under severe conditions of 2,500° C. when baking Goryeo celadon, and it can have a great advantage in corresponding to an oxidation preventing material of semiconductor technology.

The invention claimed is:

1. A method of manufacturing a transparent conductive film, the method comprising:
   preparing a substrate; and
   forming a thin film of a compound of the following Formula 1 on the substrate:

$Ba_pLa_qSn_mO_n$  Formula 1 wherein:
   p, q, m and n are atomic content ratios,
   p is 1,
   m is more than 1.5 and less than or equal to 6,
   n is more than 3.9 and less than or equal to 6, and
   q is more than 0 and less than or equal to 1,
   wherein:
   the forming of the thin film is performed by an RF sputtering process at a temperature lower than 250° C.,
   the RF sputtering process is performed at a deposition rate of 0.5 Å/sec to 1.5 Å/sec,
   the RF sputtering process uses a La 5% doped $BaSnO_3$ target,
   the thin film has a thickness of 200 nm to 1,000 nm,
   the thin film has sheet resistance of 10 Ω/sq to 14 Ω/sq, and the thin film has an optical transmittance of 92% or more at a wavelength of 650 nm.

2. The method of claim 1, wherein the substrate is a glass substrate, a silicon substrate, or a plastic substrate.

3. The method of claim 1, wherein the RF sputtering process is performed at a temperature of 100° C. to 200° C.

4. The method of claim 1, wherein the thin film contains 5% La and has an optical transmittance of about 94% at a wavelength of 550 nm.

5. The method of claim 1, wherein:
   m is more than 2 and less than or equal to 4, and
   n is more than 3.9 and less than or equal to 5.43.

* * * * *